(12) United States Patent
Popp

(10) Patent No.: US 6,835,666 B2
(45) Date of Patent: Dec. 28, 2004

(54) METHOD FOR FABRICATING A MASK FOR SEMICONDUCTOR STRUCTURES

(75) Inventor: Martin Popp, Dresden (DE)

(73) Assignee: Infineon Technologies AG, Munich (DE)

(*) Notice: Subject to any disclaimer, the term of this patent is extended or adjusted under 35 U.S.C. 154(b) by 15 days.

(21) Appl. No.: 10/291,070

(22) Filed: Nov. 8, 2002

(65) Prior Publication Data

US 2003/0087167 A1 May 8, 2003

(30) Foreign Application Priority Data

Nov. 8, 2001 (DE) .......................................... 101 54 820

(51) Int. Cl.$^7$ .................... H01L 21/302; H01L 21/461
(52) U.S. Cl. ...................... 438/735; 438/736; 438/738; 438/740; 430/5
(58) Field of Search ................................ 438/735–738, 438/740, 743, 744, 624; 216/72; 430/5

(56) References Cited

U.S. PATENT DOCUMENTS

| | | | | |
|---|---|---|---|---|
| 5,158,910 A | * | 10/1992 | Cooper et al. ............... | 438/631 |
| 5,187,121 A | * | 2/1993 | Cote et al. .................. | 438/645 |
| 5,466,639 A | * | 11/1995 | Ireland ........................ | 438/633 |
| 5,888,897 A | * | 3/1999 | Liang .......................... | 438/622 |
| 6,103,629 A | * | 8/2000 | Kitch et al. ................. | 438/692 |
| 6,127,070 A | | 10/2000 | Yang et al. | |
| 6,165,889 A | * | 12/2000 | Ireland ........................ | 438/618 |
| 6,204,187 B1 | * | 3/2001 | Rupp et al. ................. | 438/702 |
| 6,296,777 B1 | | 10/2001 | Engelhardt et al. | |
| 6,303,272 B1 | * | 10/2001 | Furukawa et al. .......... | 430/314 |
| 6,387,814 B1 | * | 5/2002 | Chen .......................... | 438/700 |
| 6,410,453 B1 | * | 6/2002 | Sandhu ....................... | 438/736 |
| 6,420,257 B2 | * | 7/2002 | Ireland ........................ | 438/618 |
| 6,455,439 B2 | * | 9/2002 | Sandhu ....................... | 438/736 |
| 6,475,921 B2 | * | 11/2002 | Sandhu ....................... | 438/717 |

* cited by examiner

*Primary Examiner*—Matthew Smith
*Assistant Examiner*—Lex H. Malsawma
(74) *Attorney, Agent, or Firm*—Laurence A. Greenberg; Werner H. Stemer; Ralph E. Locher

(57) ABSTRACT

A mask is fabricated by applying a sacrificial layer on a semiconductor wafer. The sacrificial layer is then processed with the aid of a first and a second lithographic process sequence in order to pattern the sacrificial layer in a first and a second direction. A hard mask layer is subsequently applied in order to completely enclose the patterned sacrificial layer. Finally, the sacrificial layer is then removed from the hard mask layer.

5 Claims, 5 Drawing Sheets

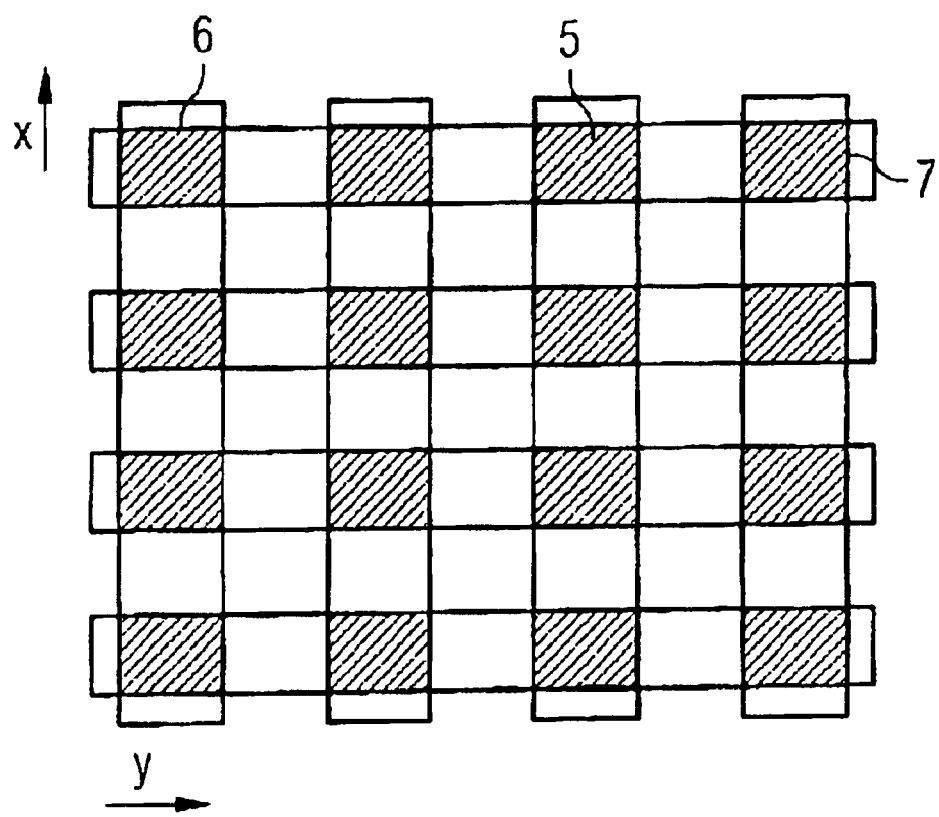

METHOD FOR FABRICATING A MASK FOR SEMICONDUCTOR STRUCTURES

BACKGROUND OF THE INVENTION

Field of the Invention

The invention lies in the field of semiconductor processing and relates, more specifically, to a method for fabricating a mask for forming structures in a semiconductor wafer.

Integrated semiconductor circuits are generally fabricated with the aid of planar technology. In the context of planar technology, the semiconductor wafers are nowadays patterned almost entirely with the aid of lithographic technology. An essential feature of this technology is the formation of a mask with the desired structure on the semiconductor wafer in order then to transfer the structure into the underlying layer of the semiconductor wafer in a subsequent process step, e.g. with the aid of an etching or an implantation. In this case, the mask generally comprises a thin radiation-sensitive layer, usually an organic photoresist layer, which is deposited on the semiconductor wafer. This thin radiation-sensitive layer is then irradiated in the desired regions, the irradiation generally being effected optically with the aid of a photomask. The photoresist layer that has been chemically altered by the radiation is then developed, wherein case, in positive resist technology, the photoresist decomposes at the exposed locations and the non-irradiated regions remain masked. In negative resist technology, in precisely the opposite fashion, the exposed locations are marked, while the unexposed resist is removed during development. The resulting pattern in the photoresist layer serves as a mask for the subsequent process step by means of which this pattern is then transferred into the underlying layer in the semiconductor wafer.

On account of the increasing miniaturization of the integrated circuits, it is necessary to image ever smaller structures with proportions of below 100 nm on the photoresist layer and then to transfer this pattern into the underlying layer of the semiconductor wafer. The lithographic production of such small structures is difficult particularly in regions with a dense arrangement of structures with dimensions in the region of the resolution limit of the optical exposure methods. This applies in particular to the fabrication of masks for trench or stacked capacitors in a memory cell array. Thus, during the imaging of small elongate structures, the so-called line shorting problem occurs, wherein patterns with significantly shortened lengths or widths are produced in the mask layer. Furthermore, in the case of very small structures, the problem of so-called corner rounding arises, wherein, instead of the desired edges, round corners are formed in the resist pattern as a result of the exposure at the resolution limit.

In order to combat these problems in the formation of masks for small structures, the structures are often imaged on the mask layer in such a way that the imaging errors are already taken into account. Thus, in accordance with so-called mask biasing, the structures to be imaged are intentionally lengthened relative to the desired structure or the mask is drawn with additional auxiliary structures which compensate for the imaging errors from the outset. However, this necessitates a complicated mask design, and the risk of imaging errors still exists.

SUMMARY OF THE INVENTION

It is accordingly an object of the invention to provide a method of fabricating a mask which overcomes the above-mentioned disadvantages of the heretofore-known devices and methods of this general type and which allows a mask pattern to be reliably fabricated even for very small structures.

With the foregoing and other objects in view there is provided, in accordance with the invention, a method of fabricating a mask, which comprises the following method steps:
 a) depositing a sacrificial layer on a semiconductor wafer;
 b) processing the sacrificial layer in a first lithographic process sequence for patterning the sacrificial layer with a first pattern;
 c) processing the sacrificial layer in a second lithographic process sequence for patterning the sacrificial layer with a second pattern;
 d) applying a hard mask layer to completely enclose the sacrificial layer patterned in steps b) and c); and
 e) removing the sacrificial layer from the hard mask layer.

In other words, according to the invention, in order to create a mask, firstly a sacrificial layer is applied on a semiconductor wafer, this sacrificial layer is then patterned with the aid of two successive lithographic process sequences, the sacrificial layer being processed for the purpose of forming a first mask pattern with the aid of the first lithographic process sequence and the sacrificial layer being processed for the purpose of forming a second mask pattern with the aid of the second lithographic process sequence, a hard mask layer is then applied in order to completely enclose the patterned sacrificial layer and the sacrificial layer is subsequently removed again laterally from the hard mask layer.

The method according to the invention makes it possible to produce a hard mask in the case of which even very fine structures packed extremely densely are imaged in a dimensionally accurate manner. Therefore, the method according to the invention is suitable in particular for the fabrication of integrated circuits with DRAM modules. The problems of line shortening and corner rounding can be avoided through the formation of an inverted mask with the aid of a sacrificial layer, which is furthermore subjected to a double lithography process, wherein a first line pattern is produced in a first direction and then a second line pattern is produced in a second direction. The mask fabrication technique according to the invention furthermore ensures that a hard mask of extremely uniform thickness is produced, thereby reliably avoiding damage to the mask during the transfer of the mask pattern into the underlying layer.

In accordance with an added feature of the invention, the sacrificial layer is processed in the successive lithography processes in two mutually perpendicular directions with a strip pattern in each case. As a result, rectangular structures, in particular capacitor structures in DRAMs, can be produced in a dimensionally accurate manner with exact edges.

In accordance with an additional feature of the invention, an etching stop layer is provided between the sacrificial layer and the semiconductor wafer, and etching processes for the sacrificial layer can be reliably stopped by means of the etching stop layer. This additional etching layer avoids the situation where the layer lying under the sacrificial layer is damaged in the context of the processing of the sacrificial layer.

In accordance with a further preferred embodiment, an additional intermediate mask layer is provided under the sacrificial layer, which is patterned in accordance with the pattern of the hard mask layer that is uncovered by the removal of the sacrificial layer. The use of this additional intermediate mask layer makes it possible to embody a highly exact uniform mask for subsequent patterning processes of the semiconductor layer lying under the intermediate mask layer.

According to the invention, it is also advantageous, during the application of the hard mask layer, to deposit the hard mask layer over the whole area in order to completely bury the patterned sacrificial layer and then to planarize the hard mask layer preferably with the aid of chemical mechanical polishing in order to uncover the surface of the patterned sacrificial layer. This ensures that a hard mask layer with high uniformity with regard to the thickness is produced and, at the same time, the sacrificial layer to be removed with the inverted mask structure is completely uncovered.

Other features which are considered as characteristic for the invention are set forth in the appended claims.

Although the invention is illustrated and described herein as embodied in a method for fabricating a mask for semiconductor structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a plan view showing a possible configuration of the two masks for patterning the sacrificial layer.

DESCRIPTION OF THE PREFERRED EMBODIMENTS

Figure 1A:
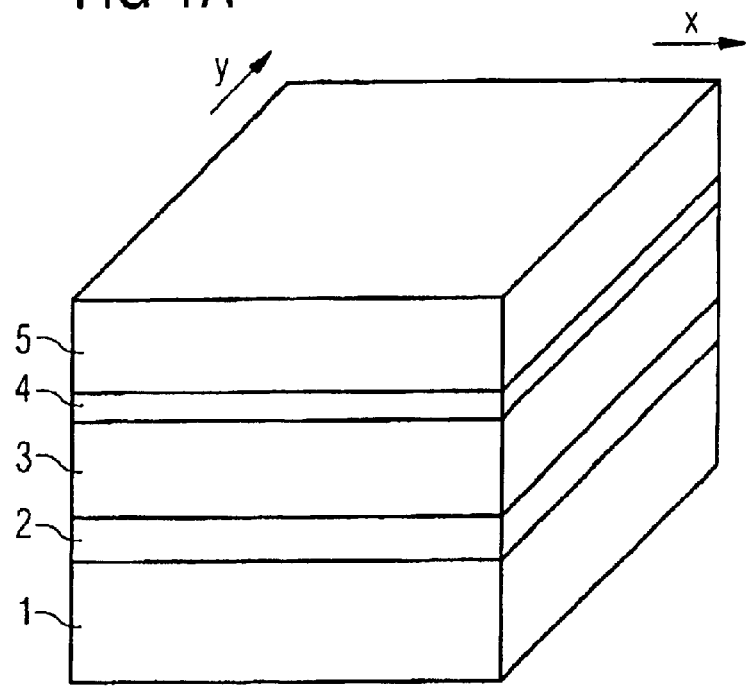
FIGS. 1A to 1H are perspective illustrations of a semiconductor wafer after various process steps for forming a hard mask according to the invention.

Referring now to the figures of the drawing in detail and first, particularly, to FIGS. 1A to 1H thereof, there is shown a possible process sequence for fabricating a mask on a semiconductor wafer. The individual figures each represent a perspective view of the silicon wafer after the last process step described in each case.

The mask fabrication method according to the invention can also be used, in principle, for patterning other semiconductor materials. For simplification, the silicon wafer 1 is illustrated as a uniform block. However, the mask fabrication according to the invention can be used, in principle, in any process stage for fabricating an integrated circuit on the silicon wafer in order to pattern a semiconductor layer.

In the planar technology that is customarily used, integrated circuits are embodied, in principle, by means of a sequence of individual processes which act in each case over the whole area of the wafer surface and usually lead in a targeted manner, by means of suitable mask layers, to the local alteration of the semiconductor material. In the case of the process sequence shown in FIGS. 1A to 1H, it is an aim to fabricate a mask with a dense pattern of rectangular structures, as are required e.g. for producing trench capacitors in DRAMs. However, the process sequence according to the invention makes it possible to fabricate masks with any desired pattern structures.

In the case of the sequence of process events shown in FIGS. 1A to 1H, in a first process sequence, a buffer layer 2 is deposited on the silicon wafer 1 over the whole area, which buffer layer provides for improved adhesion of the hard mask layer 3 that is subsequently applied. In this case, the buffer layer 2 is preferably a nitride layer, and the hard mask layer 3 is an oxide layer or a BPSG layer. An etching stop layer 4 is deposited on the hard mask layer 2 over the whole area, a sacrificial layer 5 being applied in turn on the etching stop layer. The material of the etching stop layer 4 is chosen such that etchings carried out at the sacrificial layer 5 are reliably stopped. A TEOS oxide is preferably used as the sacrificial layer 5, whereas an oxynitride is preferably suitable as the etching stop layer 4. The application of the individual layers in the layer stack shown in FIG. 1A is effected with the aid of known layer techniques. In this case, the thickness of the individual layers is set according to their function, wherein case the hard mask layer 3, in particular, must have a sufficient layer thickness in order to withstand the process sequence carried out for locally processing the silicon wafer lying under the hard mask layer 3 after the mask fabrication. This applies in particular to the etching steps used in this case. The thickness of the etching stop layer 4 is defined such that it even withstands a double etching process of the sacrificial layer 5 without breaking up.

Figure 1B:
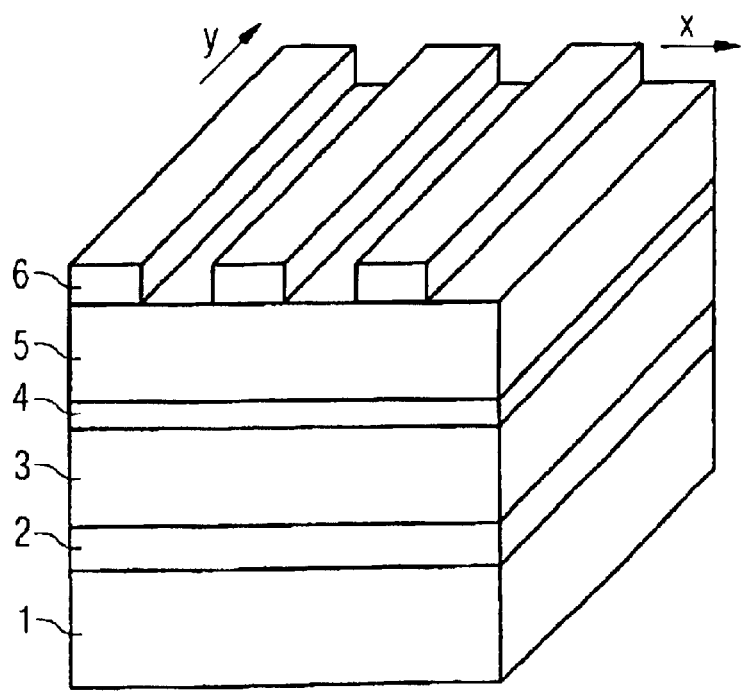

For the patterning of the sacrificial layer 5, a photomask is produced in the first process step. For this purpose, an adhesion promoter is applied on the sacrificial layer 5, and afterward a thin radiation-sensitive layer 6, preferably an organic photoresist layer, is deposited in a large-area manner. This photoresist layer 6 is then exposed using a mask. In this case, the photoresist 6 is usually exposed with UV light, the exposure mask generally being a chromium layer on a transparent carrier which contains the pattern to be imaged. However, the exposure can also be effected without masks by means of an electron beam or by means of special masks with X-ray radiation. In this case, the structure drawn on the photoresist 6 corresponds to the line structure of the desired design pattern in a first direction, in the X direction in the process sequence illustrated, the inverted areas with respect to the pattern being exposed. After the exposure, the resist layer 6 is then developed, the photoresist decomposing at the exposed locations, whereas the non-irradiated regions remain masked. FIG. 1B perspectively shows the silicon wafer 1 with the layer stack that has been produced and patterned after this process step, a resist mask 6 being produced with a strip pattern that is perpendicular to the X direction.

Figure 1C:
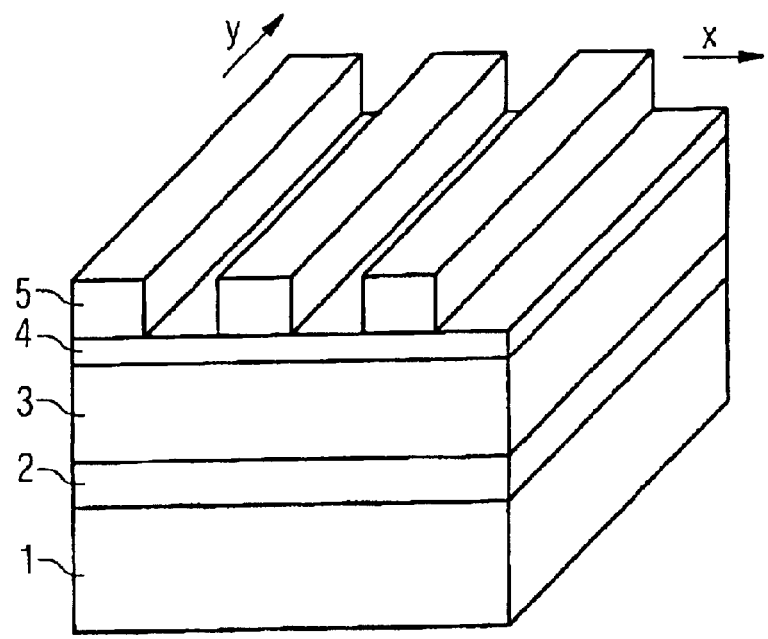

In a subsequent process step, the sacrificial layer 5 is then etched anisotropically according to the strip pattern of the resist layer 6, the etching being stopped by the etching stop layer 5. Afterward, the remaining photoresist layer 6 is removed. FIG. 1C shows the silicon wafer 1 with the layer stack after this process step, a perpendicular strip pattern being formed in the sacrificial layer 5.

Figure 1D:
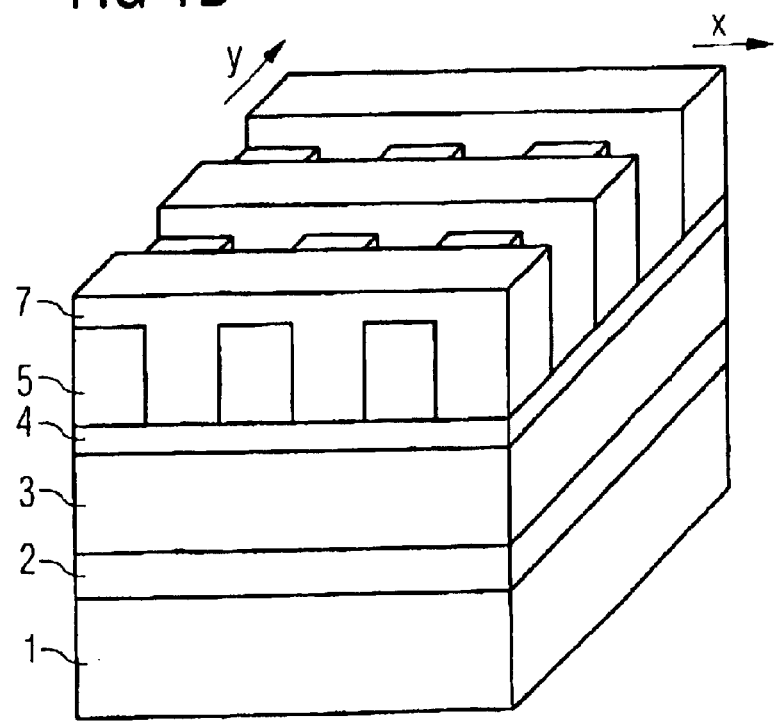

The sacrificial layer 5 is then patterned in the Y direction by means of a second lithography process sequence. For this purpose, once again after an adhesion layer, a resist layer 7 is applied in a large-area manner, on which resist layer the line pattern is drawn in the Y direction by exposure. For this purpose, the inverse regions with respect to the desired pattern are exposed. Afterward, the resist layer 7 is developed, the photoresist 7 decomposing at the exposed locations, but the non-irradiated regions remaining masked. FIG. 1D shows the silicon wafer 1 with the layer stack after this process step with the patterned photoresist layer 7.

Figure 1E:
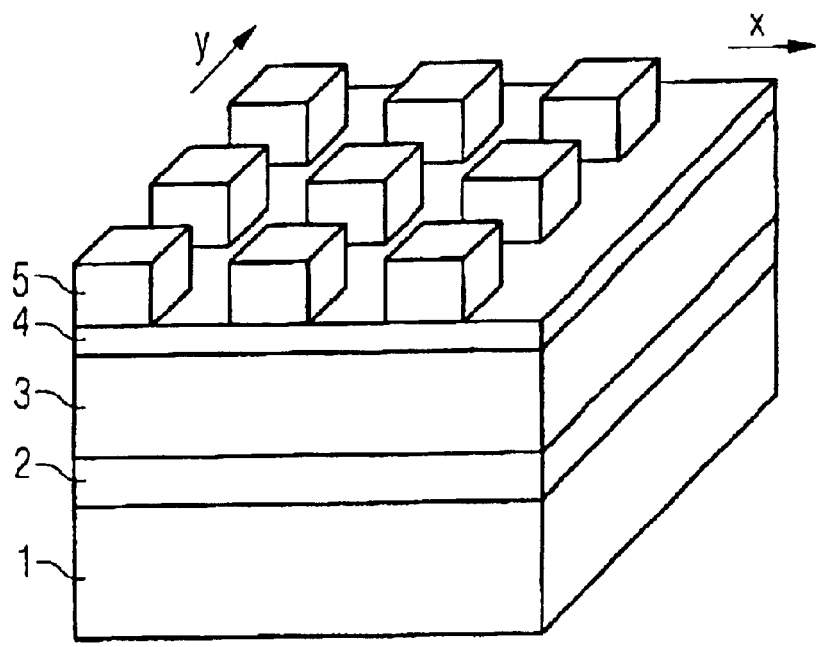

After the development of the photoresist, the uncovered regions of the sacrificial layer 6 are then etched away, the etching again being designed such that it stops on the etching stop layer 5 and does not attack the underlying layers, in particular also not at locations which have already been subjected to the first etching, i.e. at the crossover points of the opened strips. Afterward, the remaining resist mask 7 is removed again. FIG. 1E shows the silicon wafer 1 after this process step. On the surface of the etching stop layer 4, the remaining sacrificial layer 5 has a regular pattern of blocks, to be precise exactly at the locations which have not been exposed in any of the preceding resist layers. These blocks of the sacrificial layer 5 reproduce the design pattern which is intended to be formed in the semiconductor layer.

FIG. 2 again shows a plan view of the two resist masks for patterning the sacrificial layer 5. The blocks of the sacrificial layer 5 which remain after the two lithography process sequences are identified by hatching in this case.

The resist processes illustrated have been illustrated using the example of a positive resist. However, it is also possible to use the negative resist technology instead, in the case of which the photoresist at the exposed locations remains masked, while the unexposed locations of the resist are decomposed during development. In the case of this negative resist technology, the mask for writing to the resist layer must then be of exactly opposite configuration to that of the positive resist technology.

Figure 1F:
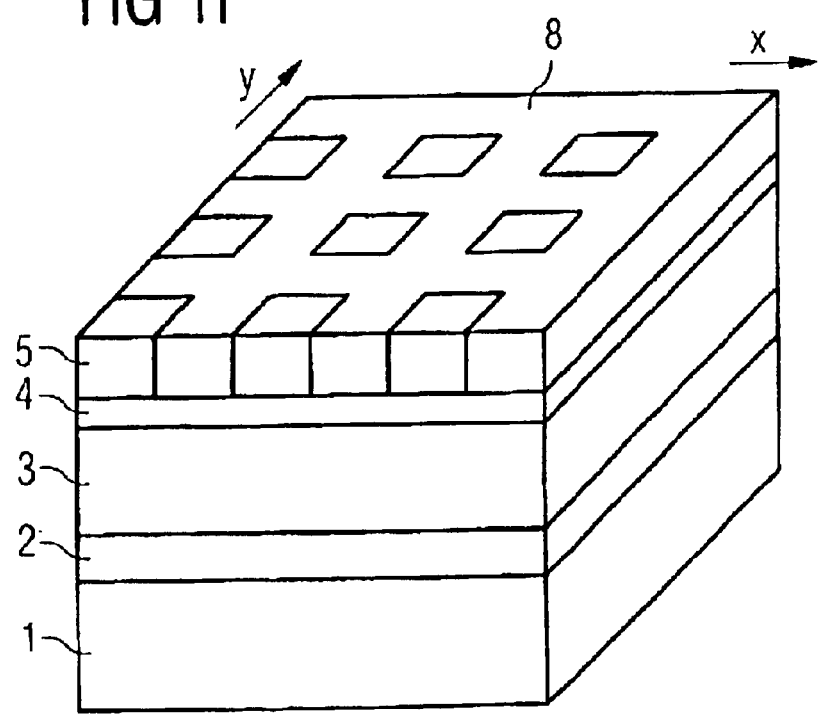

After the complete patterning of the sacrificial layer 5, which is formed such that it corresponds to the desired structure pattern in the semiconductor wafer, rectangular areas in the present case, a hard mask layer 8, preferably polysilicon, is deposited in a large-area manner and completely buries the blocks of the sacrificial layer 5. This hard mask layer 8 is then planarized in a large-area manner preferably with the aid of chemical mechanical polishing in order to achieve a completely plane surface, the planarization process stopping after the surface of the sacrificial layer 5 has been uncovered. The silicon wafer 1 with the layer sequence after this process step is shown in FIG. 1F. As an alternative to chemical mechanical polishing for planarizing the surface, it is also possible to use other removal processes for fabricating a completely plane surface.

Figure 1G:
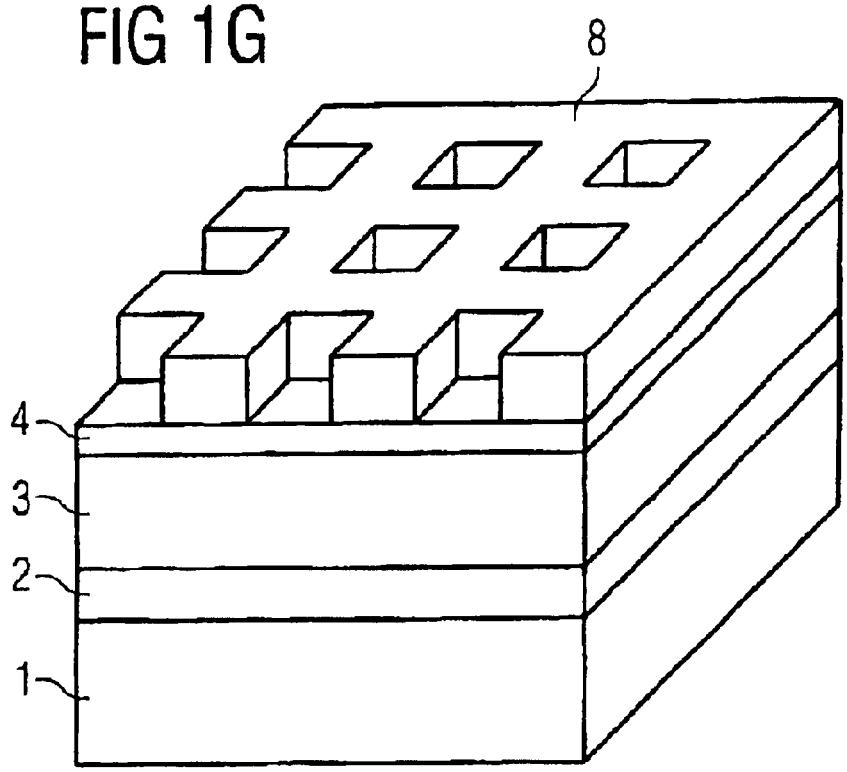
Figure 1H:
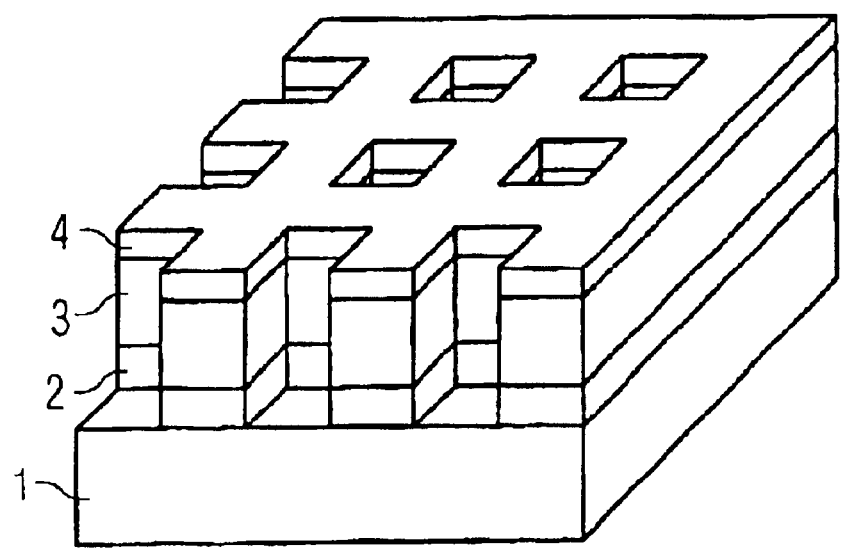

In order to form the etching mask, in a next step, the sacrificial layer 5 is then removed selectively from the mask layer 8. In the case of a sacrificial layer 5 composed of TEOS oxide, this can be done e.g. by means of a wet-chemical oxide etching. The patterned mask 8 after this process step is shown in FIG. 1G. The block pattern formed in the mask 8 can then be transferred, with the aid of a further etching sequence, into the underlying layer stack comprising etching stop layer 4, mask layer 3 and buffer layer 2, in order thus to form the mask for patterning the silicon wafer 1. After this anisotropic etching process sequence, the layer stack being etched together or successively depending on the material of the layers, the remaining mask layer 8 is removed. The silicon wafer 1 after the formation of the etching mask stack provided for patterning the silicon wafer is shown in FIG. 1H.

As an alternative to the sequence of process events shown in FIGS. 1A to 1H, it is also possible to dispense with the buffer layer 2 and the hard mask layer 3 and instead to use the mask 8 after the patterning of the etching stop layer 4 directly as a mask for transferring the design patterns into the silicon wafer 1.

The mask fabrication method according to the invention makes it possible, through the use of a double exposure for drawing the design pattern and forming an inverted mask image with the aid of the sacrificial layer, to form, in a dimensionally accurate manner, very small structures which are packed extremely densely.

I claim:

1. A method for fabricating a mask, which comprises the following method steps:
    a) depositing a sacrificial layer on a semiconductor wafer;
    b) processing the sacrificial layer in a first lithographic process sequence for patterning the sacrificial layer with a first pattern;
    c) processing the sacrificial layer in a second lithographic process sequence for patterning the sacrificial layer with a second pattern to form a patterned sacrificial layer;
    d) applying a hard mask layer to completely enclose the patterned sacrificial layer; and
    e) removing the sacrificial layer from the hard mask layer.

2. The method according to claim 1, which comprises forming the first pattern with strips extending in a given direction and forming the second pattern with strips extending in a direction perpendicular to the given direction of the first pattern.

3. The method according to claim 1, which comprises providing an etching stop layer for stopping an etching of the sacrificial layer between the sacrificial layer and the semiconductor wafer.

4. The method according to claim 1, which comprises forming an intermediate mask layer underneath the sacrificial layer, and patterning the intermediate mask layer in accordance with the pattern of the hard mask layer that is uncovered by removing of the sacrificial layer.

5. The method according to claim 1, wherein step d) comprises the following method steps:
    d1) depositing the hard mask layer with whole-area deposition to completely bury the patterned sacrificial layer; and
    d2) planarizing the hard mask layer to uncover a surface of the patterned sacrificial layer.

* * * * *